United States Patent
Wang et al.

(10) Patent No.: US 8,289,479 B2
(45) Date of Patent: Oct. 16, 2012

(54) LIQUID CRYSTAL DISPLAY COMPRISING RED, GREEN, BLUE, AND YELLOW COLOR FILTERS HAVING CHROMATICITY ON A CIE1931 CHROMATICITY DIAGRAM

(75) Inventors: Ying-Li Wang, Taichung (TW); Yun-I Liu, Hsinchu (TW); Chun-Liang Lin, Taipei County (TW); Chien-Kai Chen, Taipei (TW); Chen-Hsien Liao, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 169 days.

(21) Appl. No.: 12/960,554

(22) Filed: Dec. 6, 2010

(65) Prior Publication Data

US 2012/0069277 A1 Mar. 22, 2012

(30) Foreign Application Priority Data

Sep. 21, 2010 (TW) .............................. 99132039 A

(51) Int. Cl.
*G02F 1/1335* (2006.01)
(52) U.S. Cl. .......................... 349/106; 349/69
(58) Field of Classification Search .............. 349/69, 349/106
See application file for complete search history.

(56) References Cited

U.S. PATENT DOCUMENTS

| 7,242,543 B1 * | 7/2007 | Yang et al. ..................... 359/891 |
| 2005/0212992 A1 * | 9/2005 | Nakanishi ........................ 349/61 |
| 2007/0001587 A1 | 1/2007 | Hatwar et al. |
| 2008/0112069 A1 | 5/2008 | Helber et al. |
| 2008/0266491 A1 * | 10/2008 | Wang et al. ..................... 349/70 |
| 2009/0021269 A1 | 1/2009 | Liao et al. |
| 2009/0251639 A1 * | 10/2009 | Hsu et al. ........................ 349/69 |

* cited by examiner

*Primary Examiner* — Mark Robinson
*Assistant Examiner* — Paul Lee
(74) *Attorney, Agent, or Firm* — Jianq Chyun IP Office

(57) ABSTRACT

A liquid crystal display including a backlight unit and a liquid crystal display panel is provided. A spectrum of the backlight unit has relative relative maximum brightness peaks at wavelength between 460 nm to 480 nm, between 505 nm to 525 nm, and between 610 nm to 630 nm. The liquid crystal display panel is disposed above the backlight unit. The liquid crystal display panel has a red color filter layer ($R_x$, $R_y$, RY), a green color filter layer ($G_x$, $G_y$, GY), a blue color filter layer ($B_x$, $B_y$, BY) and a yellow color filter layer ($Y_x$, $Y_y$, YY), wherein under the backlight source, the red color filter layer, the green color filter layer, the blue color filter layer and the yellow color filter layer satisfy following conditions: $R_x \geq 0.654$; $R_y \leq 0.330$; $G_x \leq 0.253$; $G_y \geq 0.605$; $B_x \leq 0.136$; $B_y \leq 0.146$; $Y_x \leq 0.408$; $Y_y \leq 0.534$; $0.83 \leq RY/GY \leq 0.87$; $0.86 \leq GY/BY \leq 0.92$; $0.83 \leq BY/YY \leq 0.87$ and $1.5 \leq YY/RY \leq 1.55$.

7 Claims, 4 Drawing Sheets

LIQUID CRYSTAL DISPLAY COMPRISING RED, GREEN, BLUE, AND YELLOW COLOR FILTERS HAVING CHROMATICITY ON A CIE1931 CHROMATICITY DIAGRAM

CROSS-REFERENCE TO RELATED APPLICATION

This application claims the priority benefit of Taiwan application serial no. 99132039, filed on Sep. 21, 2010. The entirety of the above-mentioned patent application is hereby incorporated by reference herein and made a part of this specification.

BACKGROUND

1. Field of the Invention

The invention relates to a liquid crystal display. Particularly, the invention relates to a liquid crystal display having a good color saturation.

2. Description of Related Art

Since a liquid crystal display (LCD) has advantages of small size, high image quality, low power consumption, and no irradiation, etc., it replaces a conventional cathode ray tube (CRT) display and becomes popular in the display market. However, compared to the CRT display, the LCD generally requires a backlight source for displaying images. The backlight source used by the LCD includes a cold-cathode fluorescent lamp (CCFL) backlight source and a light emitting diode (LED) backlight source.

Since a white LED has advantages of low heat generation, low power consumption, long service life, fast response time, small size, and suitable for planar package, etc., it is regarded as "white illumination revolution". In aspect of an application market, the white LED is gradually applied in backlight modules of portable display devices and televisions due to its advantages of low power consumption, small size and fast response time, etc. However, a commonly used white LED generally uses a blue LED chip in collaboration with yttrium aluminium garnet (YAG), although it has advantages of easy package and small size, it is inadequate in performance of color saturation. Moreover, since the white LED is a dot light source, a plurality of optical films (for example, diffusion films, light-guiding plates and enhancement films, etc.) has to be used to achieve an even planar light source, so that it is hard to reduce a whole thickness and a fabrication cost of the backlight source.

In recent years, some developers developed a concept of using organic electroluminescent devices to serve as backlight sources, so as to reduce utilization of the optical films. FIG. 1 is a schematic diagram illustrating spectrums of two organic electroluminescent devices OLED-1 and OLED-2 developed by an Eastman Kodak Company, and FIG. 2 is a CIE 1931 chromaticity diagram of a LCD using the organic electroluminescent devices OLED-1 and OLED-2 as backlight sources.

When the organic electroluminescent devices OLED-1 and OLED-2 of the Eastman Kodak Company are used as the backlight sources, color coordinates (x, y) and luminance (Y) of red color, green color, blue color and white color displayed by the LCD are listed in a following table. Moreover, color saturations (NTSC %) of the LCD are also listed in the following table.

According to the above table, it is known that when the organic electroluminescent devices OLED-1 and OLED-2 of the Eastman Kodak Company are used as the backlight sources, the color coordinates of the white colors displayed by the LCD are respectively (0.255, 0.254) and (0.325, 0.326), which are obviously different to the color coordinates (0.28, 0.29) of the white color displayed by a general television product. Moreover, when the organic electroluminescent devices OLED-1 and OLED-2 of the Eastman Kodak Company are used as the backlight sources, the color saturations (NTSC %) of the LCD are only 72.1% and 61.7% (shown in FIG. 2). Obviously, when the organic electroluminescent devices OLED-1 and OLED-2 of the Eastman Kodak Company are used as the backlight sources, problems of poor color saturations and undesired color coordinates of the white color are occurred.

SUMMARY OF THE INVENTION

The invention is directed to a liquid crystal display (LCD), which has a good color saturation and white color performance.

The invention provides a LCD including a backlight source and a LCD panel. A spectrum of the backlight source has relative relative maximum brightness peaks at wavelength between 460 nm and 480 nm, between 505 nm and 525 nm, and between 610 nm and 630 nm. The LCD panel is disposed above the backlight source. The LCD panel has a red color filter layer, a green color filter layer, a blue color filter layer and a yellow color filter layer, wherein the red color filter layer, the green color filter layer, the blue color filter layer and the yellow color filter layer satisfy following conditions: under the backlight source, an x-coordinate and a y-coordinate of the red color filter layer on a CIE1931 chromaticity diagram are respectively $R_x$ and $R_y$, and a luminance is RY, wherein $R_x \geq 0.654$ and $R_y \leq 0.330$; under the backlight source, an x-coordinate and a y-coordinate of the green color filter layer on the CIE1931 chromaticity diagram are respectively $G_x$ and $G_y$, and a luminance is GY, wherein $G_x \leq 0.253$, $G_y \geq 0.605$, and $0.83 \leq RY/GY \leq 0.87$; under the backlight source, an x-coordinate and a y-coordinate of the blue color filter layer on the CIE1931 chromaticity diagram are respectively $B_x$ and $B_y$, and a luminance is BY, wherein $B_x \leq 0.136$, $B_y \leq 0.146$, and $0.86 \leq GY/BY \leq 0.92$; under the backlight source, an x-coordinate and a y-coordinate the yellow color filter layer on the CIE1931 chromaticity diagram are respectively $Y_x$ and $Y_y$, and a luminance is YY, wherein $Y_x \leq 0.408$, $Y_y \leq 0.534$, $0.83 \leq BY/YY \leq 0.87$, and $1.5 \leq YY/RY \leq 1.55$.

In an embodiment of the invention, the backlight source is an organic electroluminescent device.

In an embodiment of the invention, the backlight source has a relative maximum brightness peak BL1 when the wavelength is between 460 nm and 480 nm, the backlight source has a relative maximum brightness peak BL2 when the wavelength is between 505 nm and 525 nm, the backlight source has a relative maximum brightness peak BL3 when the wavelength is between 610 nm and 630 nm, and BL1:BL2:BL3=0.97:0.99:0.77.

|  | Rx | Ry | RY | Gx | Gy | GY | Bx | By | BY | Wx | Wy | WY | NTSC |
|---|---|---|---|---|---|---|---|---|---|---|---|---|---|
| Patent OLED1 | 0.639 | 0.337 | 5.29 | 0.250 | 0.580 | 14.77 | 0.139 | 0.064 | 3.22 | 0.255 | 0.254 | 7.76 | 72.1% |
| Patent OLED2 | 0.646 | 0.343 | 7.56 | 0.259 | 0.544 | 13.27 | 0.120 | 0.112 | 2.99 | 0.325 | 0.326 | 7.94 | 61.7% |

In an embodiment of the invention, the backlight source has a relative maximum brightness peak BL1 when the wavelength is about 470 nm, the backlight source has a relative maximum brightness peak BL2 when the wavelength is about 515 nm, the backlight source has a relative maximum brightness peak BL3 when the wavelength is about 620 nm, and BL1:BL2:BL3=0.97:0.99:0.77.

In an embodiment of the invention, $R_x+G_y+B_y+Y_y \geq 1.939$.

In an embodiment of the invention, $0.664 \geq R_x \geq 0.654$, $0.330 \geq R_y \geq 0.320$, $0.253 \geq G_x \geq 0.243$, $0.615 \geq G_y \geq 0.605$, $0.136 \geq B_x \geq 0.126$, $0.146 \geq B_y \geq 0.136$, $0.408 \geq Y_x \geq 0.398$, and $0.534 \geq Y_y \geq 0.524$.

According to the above descriptions, in the present application, a spectrum of the backlight source has relative relative maximum brightness peaks at wavelength between 460 nm and 480 nm, between 505 nm and 525 nm, and between 610 nm and 630 nm is used, and the red color filter layer, the green color filter layer, the blue color filter layer and the yellow color filter layer may present specific color coordinates and luminance under such backlight source, so that the color coordinates of the white color displayed by the LCD is more close to (0.28, 0.29).

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
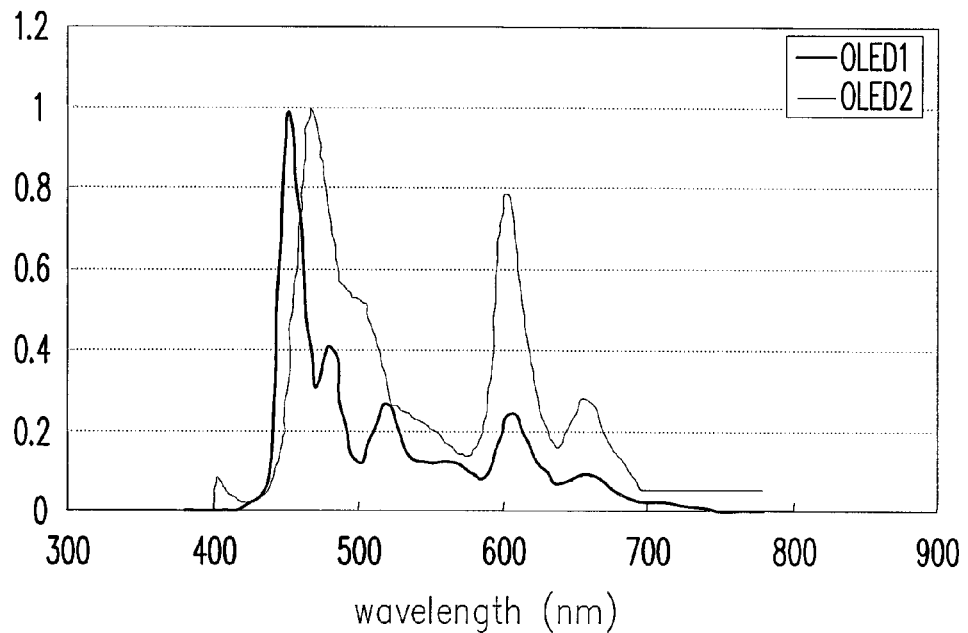
FIG. 1 is a schematic diagram illustrating spectrums of two organic electroluminescent devices OLED-1 and OLED-2 developed by an Eastman Kodak Company.
Figure 2:
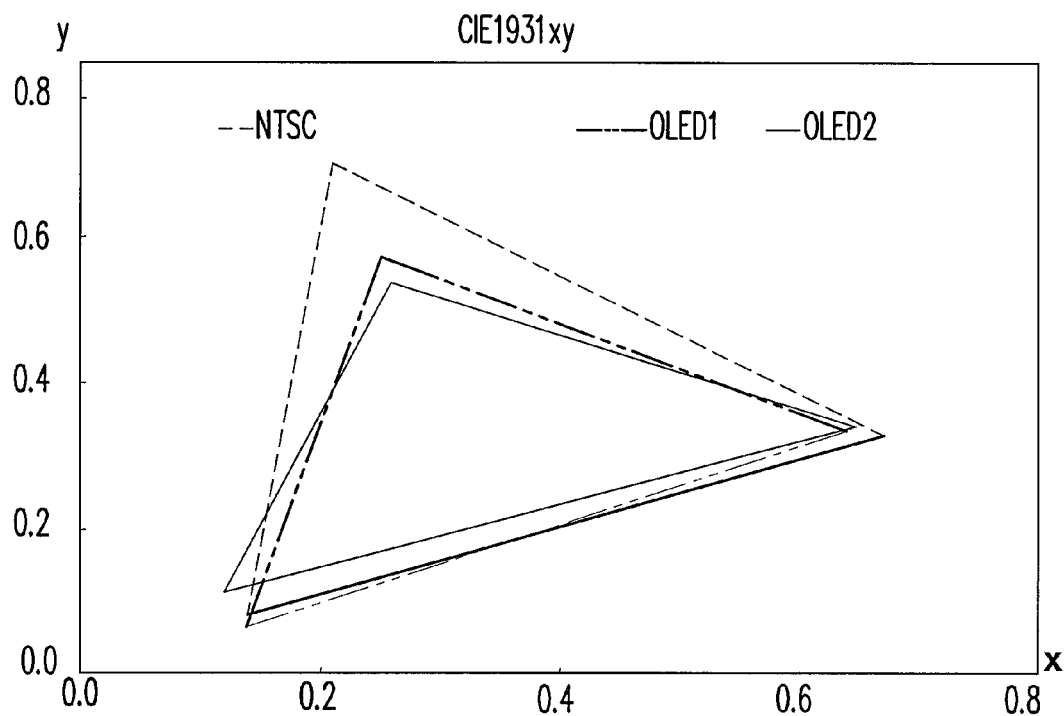
FIG. 2 is a CIE 1931 chromaticity diagram of a liquid crystal display using organic electroluminescent devices OLED-1 and OLED-2 as backlight sources.
Figure 3:
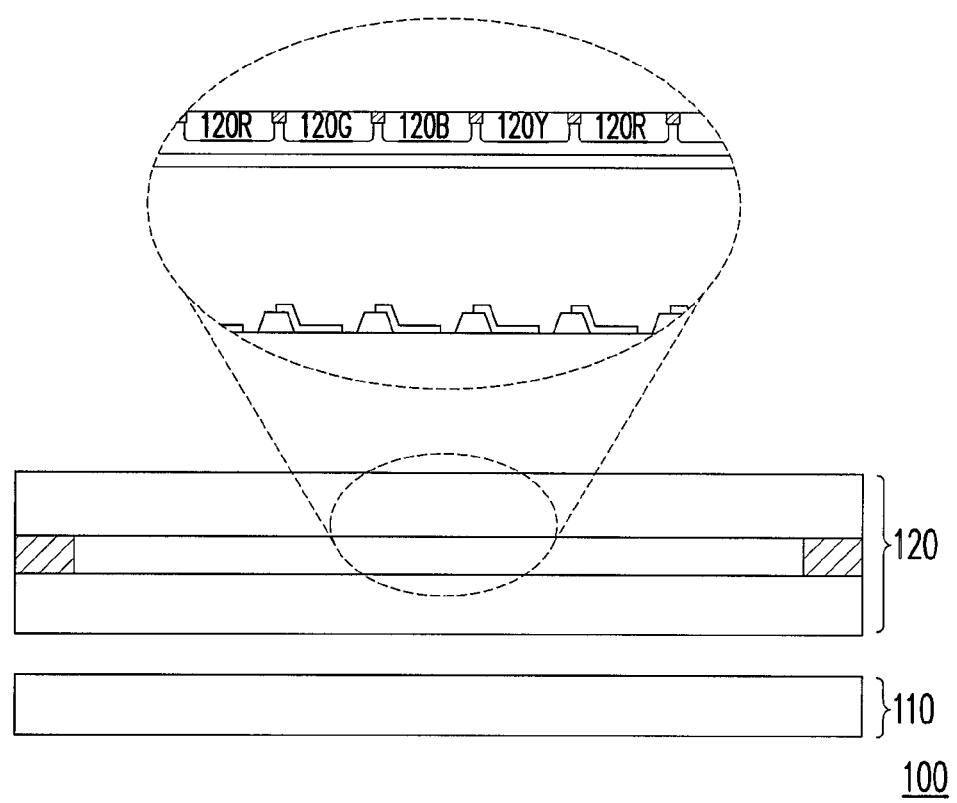
FIG. 3 is a schematic diagram illustrating a liquid crystal display according to an embodiment of the invention.
Figure 4:
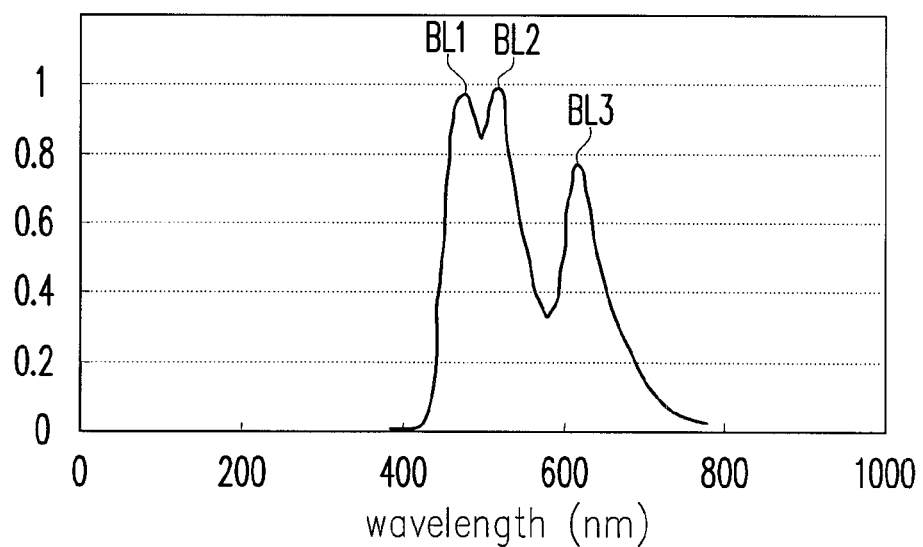
FIG. 4 is a diagram illustrating a spectrum of a backlight source of FIG. 3.

FIG. 3 is a schematic diagram illustrating a liquid crystal display (LCD) according to an embodiment of the invention. FIG. 4 is a diagram illustrating a spectrum of a backlight source of FIG. 3. Referring to FIG. 3 and FIG. 4, the LCD 100 of the present embodiment includes a backlight source 110 and a LCD panel 120. The backlight source 110 is, for example, an organic electroluminescent device, and a spectrum of the backlight source 110 has relative relative maximum brightness peaks at wavelength between 460 nm and 480 nm, between 505 nm and 525 nm, and between 610 nm and 630 nm, as that shown in FIG. 4. In the present embodiment, the backlight source 110 has a relative maximum brightness peak BL1 when the wavelength is between 460 nm and 480 nm, the backlight source 110 has a relative maximum brightness peak BL2 when the wavelength is between 505 nm and 525 nm, the backlight source 110 has a relative maximum brightness peak BL3 when the wavelength is between 610 nm and 630 nm, and BL1:BL2:BL3=0.97:0.99:0.77. For example, the backlight source has the relative maximum brightness peak BL1 when the wavelength is about 470 nm, the backlight source has the relative maximum brightness peak BL2 when the wavelength is about 515 nm, the backlight source has the relative maximum brightness peak BL3 when the wavelength is about 620 nm, and BL1:BL2:BL3=0.97:0.99:0.77.

According to FIG. 3, it is known that the LCD panel 120 is disposed above the backlight source 110, and the LCD panel 120 has a red color filter layer 120R, a green color filter layer 120G, a blue color filter layer 120B and a yellow color filter layer 120Y, wherein the red color filter layer 120R, the green color filter layer 120G, the blue color filter layer 120B and the yellow color filter layer 120Y satisfy following conditions:

The Red Color Filter Layer 120R:

Under the backlight source 110, an x-coordinate and a y-coordinate of the red color filter layer 120R on a CIE1931 chromaticity diagram are respectively $R_x$ and $R_y$, and a luminance is RY, wherein $R_x \geq 0.654$ and $R_y \leq 0.330$. In other words, under irradiation of the backlight source 110 having the spectrum shown in FIG. 4, color coordinates of a red light passing through the red color filter layer 120R is $(R_x, R_y)$, and a luminance of the red light is RY. In an exemplary embodiment, $0.664 \geq R_x \geq 0.654$ and $0.330 \geq R_y \geq 0.320$.

The Green Color Filter Layer 120G:

Under the backlight source 110, an x-coordinate and a y-coordinate of the green color filter layer 120G on the CIE1931 chromaticity diagram are respectively $G_x$ and $G_y$, and a luminance is GY, wherein $G_x \leq 0.253$, $G_y \geq 0.605$, and $0.83 \leq RY/GY \leq 0.87$. In other words, under irradiation of the backlight source 110 having the spectrum shown in FIG. 4, color coordinates of a green light passing through the green color filter layer 120G is $(G_x, G_y)$, and a luminance of the green light is GY. In an exemplary embodiment, $0.253 \geq G_x \geq 0.243$ and $0.615 \geq G_y \geq 0.605$.

The Blue Color Filter Layer 120B:

Under the backlight source 110, an x-coordinate and a y-coordinate of the blue color filter layer 120B on the CIE1931 chromaticity diagram are respectively $B_x$ and $B_y$, and a luminance is BY, wherein $B_x \leq 0.136$, $B_y \leq 0.146$, and $0.86 \leq GY/BY \leq 0.92$. In other words, under irradiation of the backlight source 110 having the spectrum shown in FIG. 4, color coordinates of a blue light passing through the blue color filter layer 120B is $(B_x, B_y)$, and a luminance of the blue light is BY. In an exemplary embodiment, $0.136 \geq B_x \geq 0.126$ and $0.146 \geq B_y \geq 0.136$.

The Yellow Color Filter Layer 120Y

Under the backlight source 110, an x-coordinate and a y-coordinate of the yellow color filter layer 120Y on the CIE1931 chromaticity diagram are respectively $Y_x$ and $Y_y$, and a luminance is YY, wherein $Y_x \leq 0.408$, $Y_y \leq 0.534$, $0.83 \leq BY/YY \leq 0.87$, and $1.5 \leq YY/RY \leq 1.55$. In other words, under irradiation of the backlight source 110 having the spectrum shown in FIG. 4, color coordinates of a yellow light passing through the yellow color filter layer 120Y is $(Y_x, Y_y)$, and a luminance of the yellow light is YY. In an exemplary embodiment, $0.408 \geq Y_x \geq 0.398$ and $0.534 \geq Y_y \geq 0.524$.

Overall, in an embodiment of the invention, the x-coordinate of the red color filter layer 120R on the CIE1931 chromaticity diagram $R_x$, the y-coordinate of the green color filter layer 120G on the CIE1931 chromaticity diagram $G_y$, the y-coordinate of the blue color filter layer 120B on the CIE1931 chromaticity diagram $B_y$, and the y-coordinate of the yellow color filter layer 120Y on the CIE1931 chromaticity diagram $Y_y$ satisfy $R_y+G_y+B_y+Y_y \geq 1.919$, and in an exemplary embodiment, satisfy $R_x+G_y+B_y+Y_y \geq 1.939$.

Figure 5A:
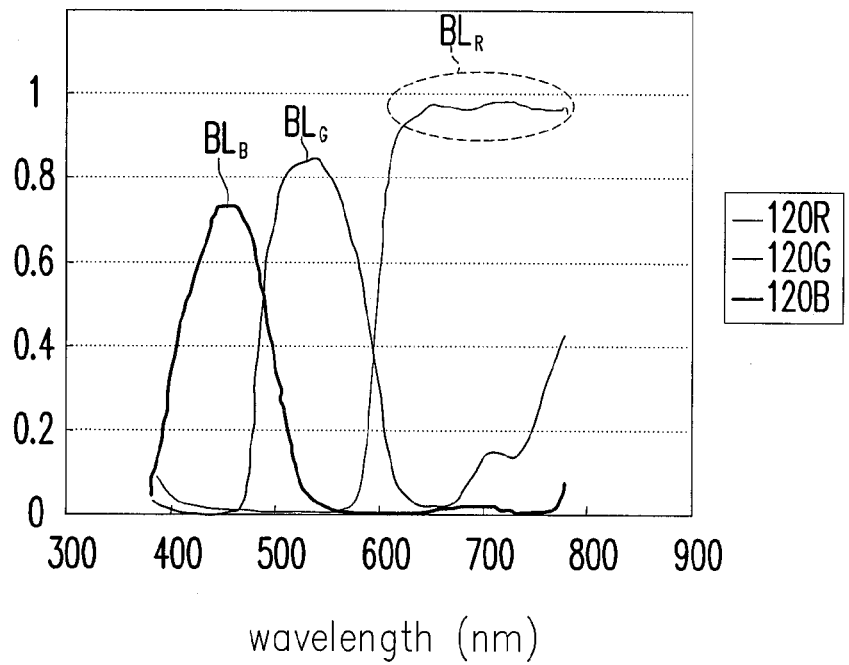
FIG. 5A is a diagram illustrating transmission spectrums of a red color filter layer, a green color filter layer and a blue color filter layer of FIG. 3.
Figure 5B:
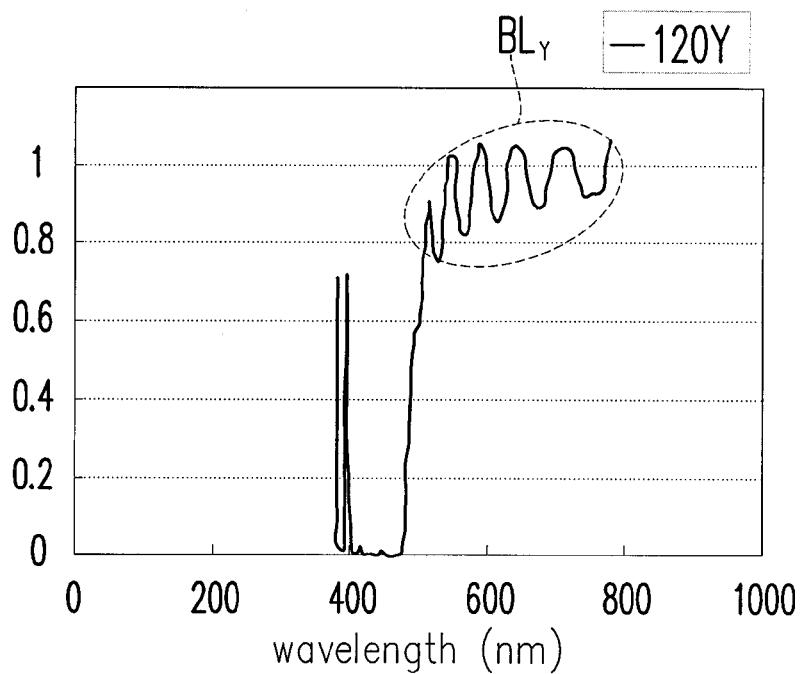
FIG. 5B is a diagram illustrating a transmission spectrum of a yellow color filter layer of FIG. 3.

FIG. 5A is a diagram illustrating transmission spectrums of the red color filter layer 120R, the green color filter layer 120G and the blue color filter layer 120B of FIG. 3, and FIG. 5B is a diagram illustrating a transmission spectrum of the yellow color filter layer 120Y of FIG. 3. According to FIG. 5A and FIG. 5B, it is known that the transmission spectrums of the red color filter layer 120R has a relative maximum peak $BL_R$ at the wavelength between 700 nm and 730 nm, the transmission spectrums of the green color filter layer 120G has a relative maximum peak $BL_G$ at the wavelength between 520 nm and 550 nm, the transmission spectrums of the blue color filter layer 120B has a relative maximum peak $BL_B$ at the wavelength between 450 nm and 470 nm, and the transmission spectrums of the yellow color filter layer 120Y has a relative maximum peak $BL_Y$ at the wavelength between 570 nm and 600 nm.

Figure 6:
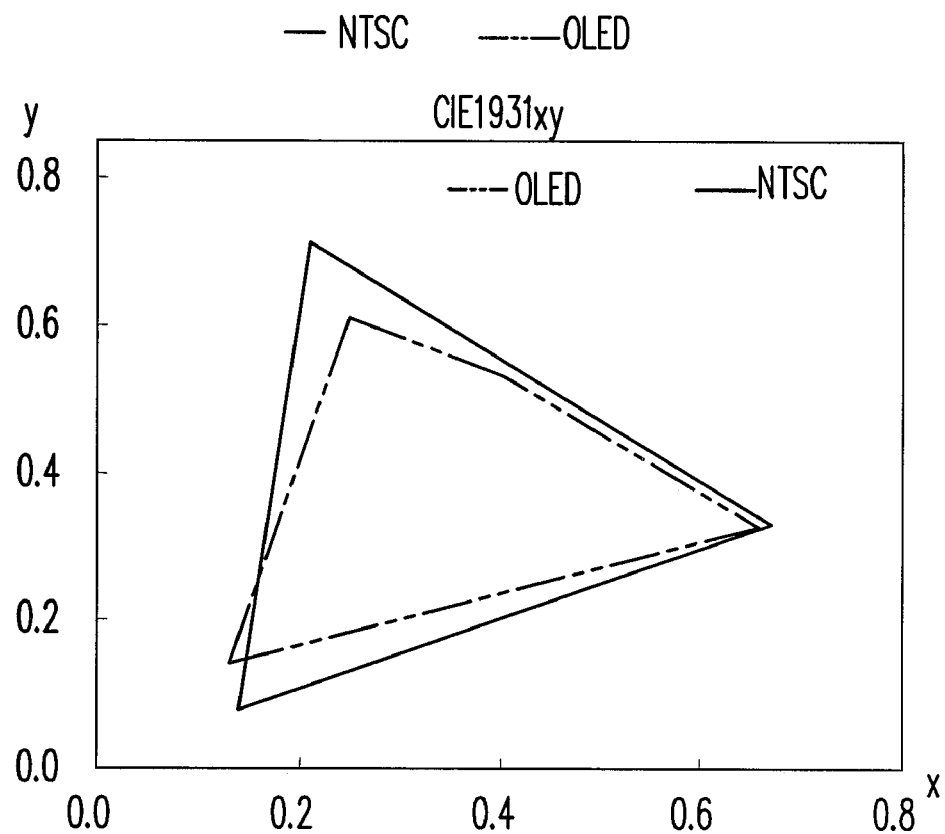
FIG. 6 is a CIE 1931 chromaticity diagram of a liquid crystal display according to an embodiment of the invention.

FIG. 6 is a CIE 1931 chromaticity diagram of the LCD of the present embodiment. Referring to FIG. 4 and FIG. 6, when the backlight source 110 having the spectrum shown in FIG. 4 is used, color coordinates (x, y) and luminance (Y) of red color, green color, blue color and white color displayed by the LCD 100 are listed in a following table. Moreover, a color saturation (NTSC %) of the LCD 100 is also listed in the following table:

| | Rx | Ry | RY | Gx | Gy | GY | Bx | By | BY | Yx | Yy | YY | Wx | Wy | WY | NTSC % |
|---|---|---|---|---|---|---|---|---|---|---|---|---|---|---|---|---|
| RGBY | 0.659 | 0.325 | 5.21 | 0.243 | 0.610 | 6.05 | 0.131 | 0.141 | 6.792 | 0.403 | 0.529 | 7.97 | 0.285 | 0.292 | 4.56 | 75.0 |

According to the above table, it is known that when the backlight source 110 having the spectrum shown in FIG. 4 is used, the color coordinates of the white color displayed by the LCD 100 is (0.285, 0.292), which is not obviously different to the color coordinates (0.28, 0.29) of the white color displayed by a general television product. Moreover, when the backlight source 110 having the spectrum shown in FIG. 4 is used, the color saturation (NTSC %) of the LCD 100 is 75% (shown in FIG. 6). Obviously, when the backlight source 110 having the spectrum shown in FIG. 4 is used, the color saturation of the LCD 100 is increased by a certain degree, and the color coordinates of the white color displayed by the LCD 100 is quite close to a design requirement of the television product.

Experiment

In a following table, $W_x$, $W_y$, WY and color saturations (NTSC %) corresponding to different $R_x$, $R_y$, $G_x$, $G_y$, $B_x$, $B_y$, $Y_x$, $Y_y$, RY, GY, BY and YY are listed. According to the following table, it is known that the color coordinates of the white color displayed by the LCD 100 of the invention is quite close to (0.28, 0.29), while the color saturations are maintained to be greater than 70%.

In summary, in the present application, a spectrum of the backlight source has relative relative maximum brightness peaks at wavelength between 460 nm and 480 nm, between 505 nm and 525 nm, and between 610 nm and 630 nm, and the red color filter layer, the green color filter layer, the blue color filter layer and the yellow color filter layer may present specific color coordinates and luminance under such backlight source, so that the color coordinates of the white color displayed by the LCD is more close to (0.28, 0.29).

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A liquid crystal display, comprising:
   a backlight source, wherein a spectrum of the backlight source has relative maximum brightness peaks at wavelength between 460 nm and 480 nm, between 505 nm and 525 nm, and between 610 nm and 630 nm; and
   a liquid crystal display panel disposed above the backlight source and having a red color filter layer, a green color filter layer, a blue color filter layer and a yellow color filter layer, wherein the red color filter layer, the green color filter layer, the blue color filter layer and the yellow color filter layer satisfy following conditions:
   under the backlight source, an x-coordinate and a y-coordinate of the red color filter layer on a CIE1931 chromaticity diagram are respectively $R_x$ and $R_y$, and a luminance is RY, wherein $R_x \geq 0.654$ and $R_y \leq 0.330$;
   under the backlight source, an x-coordinate and a y-coordinate of the green color filter layer on the CIE1931 chromaticity diagram are respectively $G_x$ and $G_y$, and a luminance is GY, wherein $G_x \leq 0.253$, $G_y \geq 0.605$, and $0.83 \leq RY/GY \leq 0.87$;
   under the backlight source, an x-coordinate and a y-coordinate of the blue color filter layer on the CIE1931 chromaticity diagram are respectively $B_x$ and $B_y$, and a luminance is BY, wherein $B_x \leq 0.136$, $B_y \leq 0.146$, and $0.86 \leq GY/BY \leq 0.92$; and
   under the backlight source, an x-coordinate and a y-coordinate of the yellow color filter layer on the CIE1931 chromaticity diagram are respectively $Y_x$ and $Y_y$, and a luminance is YY, wherein $Y_x \leq 0.408$, $Y_y \leq 0.534$, $0.83 \leq BY/YY \leq 0.87$, and $1.5 \leq YY/RY \leq 1.55$.

2. The liquid crystal display as claimed in claim 1, wherein the backlight source is an organic electroluminescent device.

| Rx | Ry | RY | Gx | Gy | GY | Bx | By | BY | Yx | Yy | YY | Wx | Wy | WY | NTSC % |
|---|---|---|---|---|---|---|---|---|---|---|---|---|---|---|---|
| 0.659 | 0.325 | 5.21 | 0.248 | 0.610 | 6.05 | 0.131 | 0.141 | 6.79 | 0.403 | 0.529 | 7.97 | 0.285 | 0.292 | 4.56 | 71.4 |
| 0.664 | 0.325 | 5.21 | 0.253 | 0.610 | 6.05 | 0.136 | 0.141 | 6.79 | 0.403 | 0.529 | 7.97 | 0.289 | 0.292 | 8.67 | 71.4 |
| 0.654 | 0.325 | 5.21 | 0.244 | 0.610 | 6.05 | 0.127 | 0.141 | 6.79 | 0.398 | 0.529 | 7.97 | 0.281 | 0.292 | 8.67 | 71.3 |
| 0.659 | 0.330 | 5.21 | 0.248 | 0.615 | 6.05 | 0.131 | 0.145 | 6.79 | 0.403 | 0.534 | 7.97 | 0.286 | 0.298 | 8.67 | 71.6 |
| 0.659 | 0.320 | 5.21 | 0.248 | 0.605 | 6.05 | 0.131 | 0.136 | 6.79 | 0.403 | 0.524 | 7.97 | 0.283 | 0.285 | 8.67 | 71.4 |

3. The liquid crystal display as claimed in claim 1, wherein the backlight source has a relative maximum brightness peak BL1 when the wavelength is between 460 nm and 480 nm, the backlight source has a relative maximum brightness peak BL2 when the wavelength is between 505 nm and 525 nm, the backlight source has a relative maximum brightness peak BL3 when the wavelength is between 610 nm and 630 nm, and BL1:BL2:BL3=0.97:0.99:0.77.

4. The liquid crystal display as claimed in claim 1, wherein the backlight source has a relative maximum brightness peak BL1 when the wavelength is about 470 nm, the backlight source has a relative maximum brightness peak BL2 when the wavelength is about 515 nm, the backlight source has a relative maximum brightness peak BL3 when the wavelength is about 620 nm, and BL1:BL2:BL3=0.97:0.99:0.77.

5. The liquid crystal display as claimed in claim 1, wherein $R_x+G_y+B_y+Y_y \geq 1.919$.

6. The liquid crystal display as claimed in claim 5, wherein $R_x+G_y+B_y+Y_y \geq 1.939$.

7. The liquid crystal display as claimed in claim 1, wherein $0.664 \geq R_x \geq 0.654$, $0.330 \geq R_y \geq 0.320$, $0.253 \geq G_x \geq 0.243$, $0.615 \geq G_y \geq 0.605$, $0.136 \geq B_x \geq 0.126$, $0.146 \geq B_y \geq 0.136$, $0.408 \geq Y_x \geq 0.398$, and $0.534 \geq Y_y \geq 0.524$.

* * * * *